United States Patent [19]

Beecher, II

[11] Patent Number: 4,531,176
[45] Date of Patent: Jul. 23, 1985

[54] CARTRIDGE HAVING IMPROVED ELECTROSTATIC DISCHARGE PROTECTION

[75] Inventor: Robert L. Beecher, II, Indianapolis, Ind.

[73] Assignee: AT&T Bell Laboratories, Murray Hill, N.J.

[21] Appl. No.: 507,757

[22] Filed: Jun. 27, 1983

[51] Int. Cl.³ .............................................. H05K 5/03
[52] U.S. Cl. .................................. 361/424; 174/55 B; 361/212; 361/395; 361/399
[58] Field of Search ............... 361/212, 331, 380, 395, 361/399, 415, 424, 390, 391, 400, 413; 174/5 R, 5 SB, 52 R; 339/17 N, 176 MP, 143 R

[56] References Cited

U.S. PATENT DOCUMENTS

| | | | |
|---|---|---|---|
| 2,902,630 | 9/1959 | Heazel, Jr. | 361/395 |
| 3,245,546 | 4/1966 | Stuhler | 361/415 |
| 3,270,252 | 8/1966 | Iversoen | 361/399 |
| 3,729,657 | 4/1973 | Callan | 361/399 |
| 3,917,978 | 11/1975 | Menzel | 174/5 R |
| 4,149,027 | 4/1979 | Asher | 174/52 R |
| 4,245,274 | 1/1981 | MacDonald | 361/399 |

*Primary Examiner*—G. P. Tolin
*Attorney, Agent, or Firm*—Michael A. Morra

[57] ABSTRACT

A pluggable cartridge is disclosed for housing electronic components and for insertion into a cavity of a using device, such as a telephone or video game apparatus, having a recessed electrical connector. The cartridge comprises first and second dielectric structures which when joined together form a seam. The seam is arranged to be fully inserted into the cavity before electrical contact is established between the electronic components of the cartridge and the recessed connector.

In a second embodiment of the invention, a single dielectric enclosure is utilized having an opening at one end only. A circuit board including a female dielectric connector mounted at one end is arranged to attach to the enclosure and thereby provide an inexpensive cartridge. Each disclosed embodiment offers improved electrostatic discharge (ESD) protection in minimal space.

6 Claims, 4 Drawing Figures

CARTRIDGE HAVING IMPROVED ELECTROSTATIC DISCHARGE PROTECTION

TECHNICAL FIELD

This invention relates to housing apparatus for electronic components and more particularly to pluggable cartridges for telephones, video games and the like.

BACKGROUND OF THE INVENTION

Electronic components such as Read Only Memories (ROMs) utilize devices having extremely high impedance that consume minute amounts of current. These kinds of components are advantageous insofar as the amount of circuitry that can be placed in a small area. Such components have become quite attractive for the above-mentioned reasons and their costs have come down dramatically because of their wide use in the marketplace. These components, however, are quite sensitive to electrostatic discharge (ESD) and special care must be taken in handling. ESD failures were rarely identified a few years ago, except for some very ESD-sensitive technologies such as metal-oxide semiconductor (MOS) and complementary MOS (CMOS). The cost of equipment failure includes not only circuit pack repair costs and field service calls, but, perhaps more importantly, loss of prestige for the product and possibly even the cost of an adverse product liability judgment.

It is possible for a person to inadvertently build up a static voltage in excess of 20,000 volts DC in the course of normal activities. This voltage usually dissipates without notice or harm to an individual; although occasionally, on particularly dry days when voltages can build higher than normal, sudden discharges offer momentary discomfort. While these static voltages present no real harm to humans, they are potentially lethal to certain electronic components unless precautions are taken to limit the flow of current that occurs during discharge.

Modern video games and certain telecommunications equipment provide a versatile menu of functionality by interchanging large quantities of stored data now available in very small volumes such as a ROM. A single piece of hardware is able to operate in a plurality of ways by the mere replacement of the ROM. Uninsulated ROM devices, however, are easily destroyed by ESD if all or part of the ROM is touching ground when ESD is applied.

Several methods for on-chip ESD protection reduce static damage caused by careless handling. ESD-protective networks usually consist of diode or active-device voltage clamps working in conjunction with resistors fabricated on the ROM chip. However, this protection does not come cheaply because valuable chip area, related to device production costs and yield, must be increased. Another problem is that the protection network can reduce circuit performance. In addition, an ESD hit on a device can damage the protection network itself, making it not only subject to latent failure mechanisms, but leaving it in a weakened condition. In this case, the network may fail catastrophically after exposure to a low-level ESD that the device normally would have tolerated.

Assuming that the ESD sensitive component is successfully mounted onto a circuit board, it is still necessary to provide protection from high voltages. One way is to encircle the component with a heavy ground shield. Unfortunately, this solution requires additional space for the ground shield which may also act as an antenna for both transmitting and receiving high frequency signals.

Plastic is an effective insulator, but when a plastic housing surrounds a ROM there are usually seams having small air gaps that provide a discharge path to the ROM. Gluing the seam is effective when it is without gaps, although a cost penalty is associated with the process. The effect of air gaps at a seam can be eliminated by making the plastic housing large enough to provide an approximate half-inch air space between a potential ESD source and the ROM or an electrical path connected thereto. This, however, requires a much larger overall cartridge which is undesirable in today's compact equipment where space is a premium.

It is, therefore, an object of this invention to provide a housing for a ROM or similar device that provides protection from ESD.

It is another object of this invention that the housing be of minimum dimensions.

It is yet another object of the invention to provide a housing for a ROM device that may be assembled in a cost effective manner.

SUMMARY OF THE INVENTION

In accordance with the present invention, a cartridge having improved electrostatic discharge protection is disclosed. The cartridge, insertable into a using device, includes connector means for providing electrical interconnection with a mating connector that is recessed within the using device. The cartridge comprises first and second dielectric structures which when joined together provide a protective housing for electronic components. The first dielectric structure is arranged to fit completely within the recess of the using device; and the second dielectric structure joins with the first to form a seam at their contact boundary. The second structure is an otherwise seamless protective shell that completely surrounds the electronic components.

In one illustrative embodiment of the invention the cartridge comprises a two-piece plastic assembly having interlocking members that snap together without the need for glue or screws. Guide rails molded into the plastic make proper insertion of a printed circuit board a simple matter.

In another illustrative embodiment of the invention the cartridge comprises a one-piece molded dielectric enclosure having an opening at one end only for receiving a circuit board. The circuit board includes a connector at one end that attaches to the dielectric enclosure at or near its opening. A dielectric female connector is used to advantageously offer ESD protection during handling to sensitive electronic components contained within the cartridge.

It is a feature of the present invention that cartridges can be made smaller for insertion into modern compact equipment. This feature is made possible because neither air spaces or ground shields are required.

It is another feature of the present invention that a metal handle may be used for extracting the cartridge from the using device. This feature is made possible because no seam exists in the region where the cartridge can most conveniently be grasped for extraction. These and other objects and features of the invention can be better understood from the following detailed description of the preferred embodiment of the invention as illustrated in the accompanying drawings.

DETAILED DESCRIPTION

Figure 1:
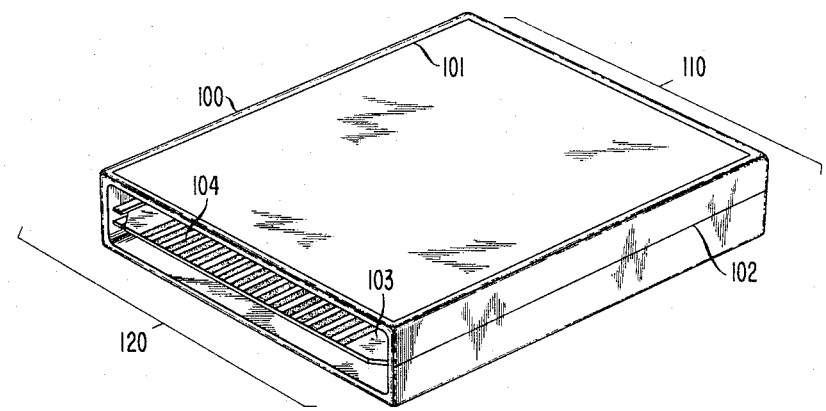
FIG. 1 illustrates a prior art cartridge such as used in conventional video games.

FIG. 1 illustrates a prior art cartridge such as used in well-known video game apparatus. Cartridge 100 houses circuit board 103 which contains electronic components appropriate for a particular video game. Electrical contacts 104 carry signals to and from the electronic components to a using device through a mating connector on the using device. The kinds of components located on circuit board 103 are typically Metal Oxide Semiconductor (MOS) devices which are more susceptible to damage from high voltages than other electronic components. Consequently, elaborate protective measures are taken in handling these components during transportation and assembly.

FIG. 1 also illustrates two well-known assembly structures for cartridges. Cartridge 100 is typically a two piece plastic structure joined together either at seam 101 or at seam 102 and is screwed or glued together. Once the cartridge and the circuit board have been assembled, it still remains subject to damage from electrostatic discharge (ESD) through user handling. This problem is partially alleviated by recessing circuit board 103 into cartridge 100 so that contacts 104 may not be touched. Note that the nature of the ESD problem is such that if the same high voltage is simultaneously present on all contacts 104, then no damage will result. Handling the cartridge, therefore, is not a problem until the voltage on one or more contacts becomes fixed and an external source of ESD is introduced. This condition occurs when the cartridge is plugged into or removed from a using device.

Air gaps in the seams provide a lower resistance path to ESD than the plastic housing itself. Air gaps are common and conservative designers provide air spaces of at least ⅛ inch within the cartridge between the enclosed electronics and the nearest seam or outside exposed metallic connection, such as a retaining screw. This air space provides sufficient resistance in the presence of a 20,000 volt source to limit current flow to a non-destructive amount. Cartridge 100 is grasped at end 110 and inserted into a using device at end 120. After the cartridge is fully inserted, seam 101 or 102 is still exposed and presents a possible discharge path through the sensitive electronics within the cartridge.

Figure 2:
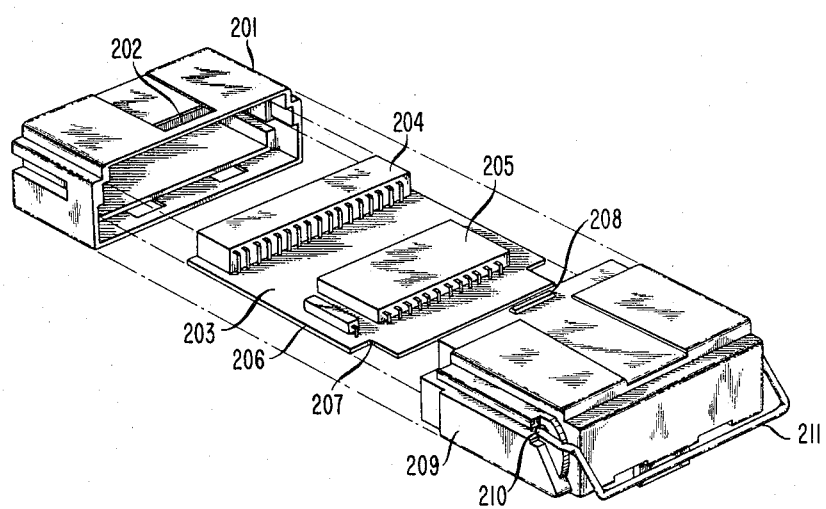
FIG. 2 discloses an exploded view of a cartridge design having improved electrostatic discharge protection in accordance with the invention.

FIG. 2 discloses an embodiment of the invention in which circuit board 203 is to be encased within a cartridge comprising mating plastic parts 201 and 209. Part 209 is a hollow plastic shell having an opening at one end and molded guide rails therein to accommodate circuit board 203. In a preferred embodiment, part 209 is molded plastic - although other materials of similar dielectric property would suffice. Guide rails within part 209 are arranged to accept edges 206 of circuit board 203 and thereby maintain the circuit board in a predetermined position. Shoulders 207 on circuit board 203 determine how far the circuit board may be inserted into plastic part 209. It is noted that electronic component 205 is a device that benefits from this cartridge design if it is particularly sensitive to ESD. Female connector 204, also located on circuit board 203, provides a recessed area to further protect electronic component 205 during handling of the cartridge. If electrical paths to component 205 were exposed, it might be possible during handling to introduce a large voltage differential between two exposed paths and thereby damage component 205.

Plastic part 209 is the only portion of the pluggable cartridge that is touched during insertion and removal from the using device. Advantageously, part 209 is without seams, so that the only ESD path of concern is the one along the outside surface from the handle toward the opening where circuit board 203 is inserted. This path is sufficiently long that it is not necessary to glue parts 209 and 201 together in an attempt to eliminate air gaps at their seam. Tab 208 of part 209 snaps into hole 202 of part 201. Part 201 also contains guide rails on which edges 206 of the circuit board slide. A tab and hole arrangement exists on the other side of plastic parts 201, 209 and is illustrated in connection with FIG. 3.

Molded indentations 210 exist on either side of plastic part 209. These indentations do not penetrate completely through the plastic shell, for to do so would render the cartridge susceptible to ESD. Indentations 210 accommodate ends of wire handle 211 allowing the handle to pivot and thereby facilitate insertion and removal of the cartridge assembly. This is especially important when the cartridge fully inserts into the using equipment in a flush mounted application. When inserted, wire handle 211 is arranged to be stored such that it also is flush with the surface of the using device. The handle further provides a grasping means and leverage in removing the cartridge from the using device when the handle pivots away from its flush storage position.

Figure 3:
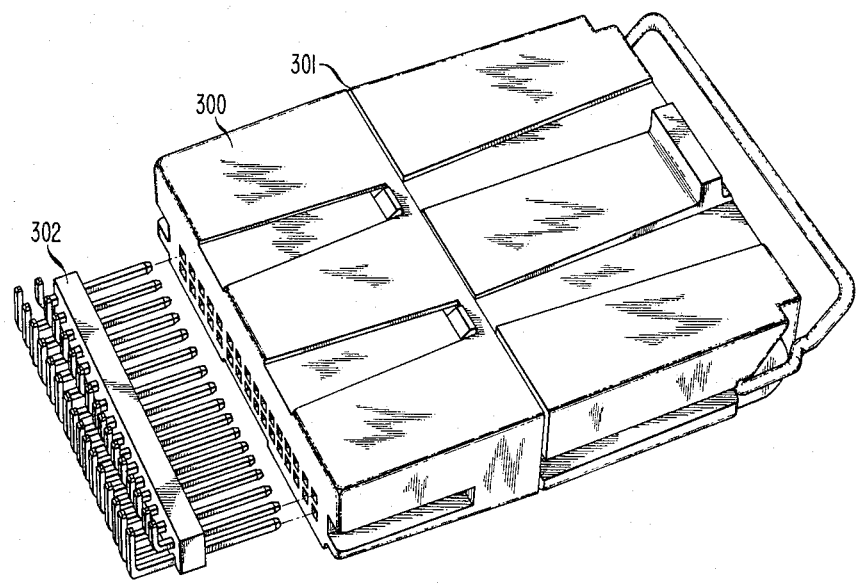
FIG. 3 discloses the cartridge of FIG. 2, after assembly, together with a male connector suitable for interconnection with the invention cartridge design.

FIG. 3 discloses fully assembled cartridge 300 in accordance with the invention together with mating connector 302 such as would reside within the cavity of a using device. Due to space limitation within equipment, however, it may not be possible to permit sufficient insertion of the cartridge, say a distance D, to protect seam 301 which may be exposed to ESD after electrical contact with connector 302 is established. This, of course, is its most vulnerable condition which is substantially remedied in the embodiment of FIG. 4.

Figure 4:
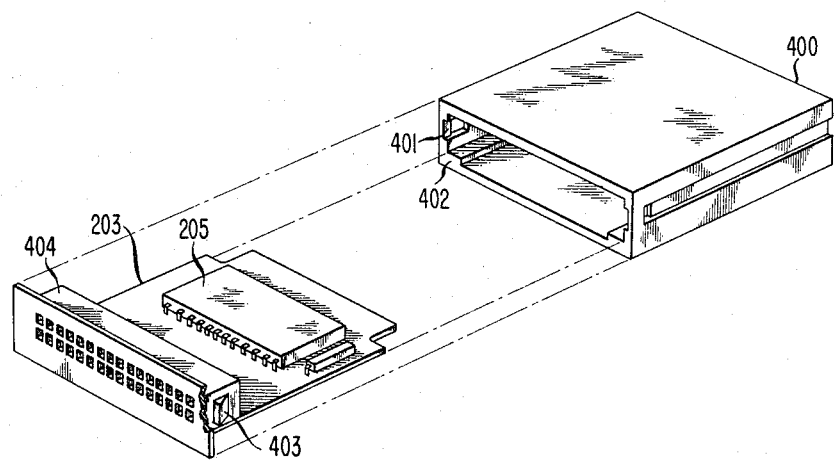
FIG. 4 discloses a second embodiment of a cartridge utilizing a one-piece dielectric enclosure in accordance with the invention.

FIG. 4 illustrates the invention wherein a one-piece molded plastic housing 400 is joined directly to circuit board 203 via female connector 404. Molded plastic housing 400 includes guide rail(s) 402 on which circuit board 203 rests after insertion. It is desirable to elevate the circuit board because of irregularities on the bottom side. These are primarily due to protruding wire leads from components mounted on the top side. Female connector 404 includes molded catch detail(s) 403 which mates with catch(es) 401. Catch detail(s) 403 is tapered to facilitate insetion into housing 400. Connector 404 further includes flanges to provide a flush fit with housing 400. A number of schemes exist for interlocking connector 404 and housing 400. Complementary ridges encircling the connector and the inside opening of the housing will also provide positive locking. The important consideration, however, is that greater force be required to separate housing 400 from connector 404 than is required to separate connector 404 from a mating connector.

FIG. 4 thus maximizes ESD protection in a physically small housing. Electronic circuit 205 is protected from high voltage discharge without being surrounded by a ground path or an air space. Only minimal insertion is necessary before the seam between housing 400 and connector 404 is rendered inaccessible. Single piece construction in a dielectric housing further provides the benefits of low cost and ease of assembly.

What is claimed is:

1. A cartridge with front and rear ends having connector means located at its front end, said connector means including metallic contacts for engaging electrical terminals of a mating connector, the cartridge comprising:
   a circuit board having one or more electronic components and said connector means electrically interconnected and mounted thereon;
   a first dielectric enclosure, comprising a hollow rectangular cavity with an opening at one end, enclosing the circuit board at the rear end of the cartridge; and
   a second dielectric enclosure, comprising a hollow rectangular cavity with an opening at one end and a plurality of spaced holes at the other end for admitting the electrical terminals of a mating connector, enclosing the circuit board at the front end of the cartridge, said first and second dielectric enclosures being removably attached to each other at their respective openings and forming a continuous seam at their points of attachment, said seam being approximately equidistant from the front end of the cartridge at all points, said metallic contacts of the connector means being fully recessed within the spaced holes of the second dielectric enclosure, the assembled cartridge having no apertures therein other than said plurality of spaced holes, whereby said one or more electronic components mounted on the circuit board are rendered inaccessible to sources of static discharge.

2. The cartridge of claim 1 further including a wire handle pivotally mountd at the rear end of said cartridge, said first section of the dielectric enclosure including indentations molded therein, but not extending therethrough, which support the wire handle.

3. The cartridge of claim 1 wherein one of the dielectric enclosures includes a tab and the other includes a slot, said tab and slot being integrally molded into its respective structure and maintaining the dielectric enclosures in a joined position, said tab filling any aperture into the cartridge created by the slot.

4. A cartridge comprising:
   a circuit board including one or more electronic components and female connector mounted thereon, the female connector being a substantially rectangular dielectric block having metallic contacts fully recessed from a front surface thereof and electrically interconnected to said one or more electronic components, the female connector further including a plurality of spaced holes in the front surface admitting electrical terminals on a mating connector for interconnection with said metallic contacts; and
   a dielectric enclosure comprising a hollow rectangular cavity having an opening at one end and enclosing the circuit board therein, said opening being shaped in conformance with the female connector and forming a continuous seal therewith, said seal being substantially equidistant from the front surface of the female connector, the only apertures into the cartridge being the spaced holes in said front surface.

5. The cartridge of claim 4 further comprising a pair of guide rails, molded into sides of the dielectric enclosure for supporting edges of the circuit board and positioning same away from walls of the enclosure.

6. The cartridge of claim 4 further including interlocking tab and slot means, integrally molded into the female connector and into the dielectric enclosure, whereby said dielectric enclosure and said female connector are removably attached to each other.

* * * * *